US00RE42872E

(19) United States
(12) Reissued Patent
Tuttle et al.

(10) Patent Number: US RE42,872 E
(45) Date of Reissued Patent: Oct. 25, 2011

(54) METHOD AND APPARATUS FOR COMMUNICATING WITH RFID DEVICES COUPLED TO A ROLL OF FLEXIBLE MATERIAL

(75) Inventors: Mark E. Tuttle, Boise, ID (US); Rickie C. Lake, Meridian, ID (US); Steven F. Schicht, Austin, TX (US); John R. Tuttle, Boulder, CO (US)

(73) Assignee: Round Rock Research, LLC, Mt. Kisco, NY (US)

( * ) Notice: This patent is subject to a terminal disclaimer.

(21) Appl. No.: 10/997,556

(22) Filed: Nov. 24, 2004

Related U.S. Patent Documents

Reissue of:
(64) Patent No.: 6,487,681
Issued: Nov. 26, 2002
Appl. No.: 09/437,718
Filed: Nov. 9, 1999

U.S. Applications:
(63) Continuation of application No. 08/306,906, filed on Sep. 15, 1994, now Pat. No. 5,983,363, which is a continuation-in-part of application No. 07/979,607, filed on Nov. 20, 1992, now Pat. No. 6,058,497.

(51) Int. Cl.
*G06F 11/00* (2006.01)
(52) U.S. Cl. ..... 714/25; 324/605; 324/613
(58) Field of Classification Search ..... 714/25; 324/605, 613, 627, 628, 758
See application file for complete search history.

(56) References Cited

U.S. PATENT DOCUMENTS

| | | | | |
|---|---|---|---|---|
| 3,679,874 | A | 7/1972 | Fickenscher | |
| 3,689,885 | A | 9/1972 | Kaplan et al. | 340/825.34 |
| 3,713,148 | A * | 1/1973 | Cardullo et al. | 342/42 |
| 3,754,170 | A | 8/1973 | Tsuda et al. | 257/659 |
| 4,384,288 | A * | 5/1983 | Walton | 340/5.8 |
| 4,704,614 | A * | 11/1987 | Poirier et al. | 343/703 |
| 4,704,734 | A | 11/1987 | Menich et al. | 455/33 |

(Continued)

OTHER PUBLICATIONS

USPTO Transaction History of related U.S. Appl. No. 07/979,607, filed Nov. 20, 1992, entitled "Testing And Burn-In Of IC Chips Using Radio Frequency Transmission," now U.S. Pat. No. 6,058,497.

(Continued)

*Primary Examiner* — Scott T Baderman
(74) *Attorney, Agent, or Firm* — Lerner, David, Littenberg, Krumholz & Mentlik, LLP

(57) ABSTRACT

[A plurality of battery-operated transceivers encapsulated by lamination to form a sheet of independent transceivers is tested in a two piece fixture that forms an enclosure surrounding each in-sheet transceiver. Each enclosure has an antenna for transmitting a command signal to the transceiver at a known power level and for receiving a reply message from the transceiver containing a power level measurement made by the transceiver. Test methods using the fixture of the present invention are also described.] *Flexible radio frequency identification (RFID) devices are coupled to a roll of flexible material. Each RFID device coupled to the roll is advanced into a wireless communication region. An antenna in the region separately communicates with each of the RFID devices in a manner that isolates the communication from other REID devices counted to the roll outside the region.*

73 Claims, 3 Drawing Sheets

U.S. PATENT DOCUMENTS 4,750,197 A 6/1988 Denekamp et al.
4,761,778 A 8/1988 Hui
4,776,464 A 10/1988 Miller et al.
4,833,402 A 5/1989 Boegh-Petersen
4,850,009 A 7/1989 Zook et al.
4,860,602 A * 8/1989 Hines et al. ..... 73/865.9
4,930,129 A 5/1990 Takahira ..... 371/40.4
4,962,485 A 10/1990 Kato et al. ..... 365/229
4,996,715 A 2/1991 Marui et al. ..... 455/33
4,999,636 A 3/1991 Landt et al.
5,008,661 A 4/1991 Raj
5,055,968 A 10/1991 Nishi et al. ..... 361/395
5,068,521 A 11/1991 Yamaguchi ..... 395/800
5,087,920 A 2/1992 Tsurumaru et al. ..... 343/700
5,113,184 A 5/1992 Katayama ..... 340/825.54
5,121,407 A 6/1992 Partyka et al.
5,148,103 A 9/1992 Pasiecznik, Jr. ..... 324/758
5,148,618 A 9/1992 Brewster
5,149,662 A 9/1992 Eichelberger ..... 437/8
5,150,114 A 9/1992 Johansson
5,153,524 A 10/1992 McCormack ..... 174/35
5,164,665 A 11/1992 Yamashita et al.
5,182,442 A 1/1993 Takahira ..... 235/492
5,198,647 A 3/1993 Mizuta ..... 235/449
5,202,838 A 4/1993 Inoue ..... 364/480
5,212,373 A 5/1993 Fujioka et al. ..... 235/482
5,219,765 A 6/1993 Yoshida et al.
5,220,158 A 6/1993 Takahira et al. ..... 235/492
5,226,167 A 7/1993 Yamaguchi ..... 395/800
5,247,577 A * 9/1993 Bailey et al. ..... 713/191
5,252,914 A 10/1993 Bobbitt et al. ..... 324/158
5,266,925 A 11/1993 Vercellotti et al. ..... 340/572
5,274,221 A 12/1993 Matsubara ..... 235/492
5,278,571 A * 1/1994 Helfrick ..... 343/703
5,279,975 A 1/1994 Devereaux et al. ..... 437/8
5,303,199 A 4/1994 Ishihara et al.
5,315,241 A 5/1994 Ewers ..... 324/158.1
5,317,255 A 5/1994 Suyama et al.
5,340,968 A 8/1994 Watanabe et al. ..... 235/380
5,343,478 A 8/1994 James et al. ..... 371/22.3
5,347,274 A 9/1994 Hassett
5,349,139 A 9/1994 Verrier et al. ..... 178/19
5,365,551 A 11/1994 Snodgrass et al. ..... 340/825.21
5,373,503 A 12/1994 Chen
5,434,394 A 7/1995 Roach et al. ..... 235/375
5,448,110 A 9/1995 Tuttle et al. ..... 257/723
5,455,575 A 10/1995 Schuermann ..... 342/42
5,521,600 A 5/1996 McEwan
5,560,970 A 10/1996 Ludebuhl
5,583,850 A 12/1996 Snodgrass
5,671,362 A 9/1997 Cowe et al.
5,672,981 A 9/1997 Fehrman
5,751,227 A 5/1998 Yoshida et al.
5,751,256 A 5/1998 McDonough et al.
5,764,655 A 6/1998 Kirihata et al. ..... 714/733
5,776,278 A * 7/1998 Tuttle et al. ..... 156/213
5,785,181 A 7/1998 Quartararo, Jr.
5,798,693 A 8/1998 Engellenner
5,801,432 A 9/1998 Rostoker et al.
5,828,693 A 10/1998 Mays et al.
5,841,770 A 11/1998 Snodgrass
5,855,988 A 1/1999 Matsuo
5,887,176 A 3/1999 Griffith et al.
5,920,287 A 7/1999 Belcher et al.
5,945,834 A 8/1999 Nakata et al.
5,949,246 A 9/1999 Frankeny et al.
5,983,363 A * 11/1999 Tuttle et al. ..... 714/25
6,045,652 A 4/2000 Tuttle et al. ..... 156/292
6,058,497 A * 5/2000 Tuttle ..... 714/733
6,121,544 A 9/2000 Petsinger
6,144,301 A 11/2000 Frieden
6,161,205 A 12/2000 Tuttle ..... 714/724
6,325,294 B2 12/2001 Tuttle et al. ..... 235/492
6,538,564 B1 3/2003 Cole
7,158,031 B2 * 1/2007 Tuttle ..... 340/572.1
7,163,152 B2 1/2007 Osborn et al.
7,175,084 B2 2/2007 Mennecart et al.
7,482,925 B2 1/2009 Hammad et al.
2001/0007335 A1 * 7/2001 Tuttle et al. ..... 235/492
2006/0187061 A1 8/2006 Colby

OTHER PUBLICATIONS

USPTO Transaction History of related U.S. Appl. No. 08/306,906, filed Sep. 15, 1994, entitled "In-Sheet Transceiver Testing," now U.S. Pat. No. 5,983,363.

USPTO Transaction History of related U.S. Appl. No. 09/193,002, filed Nov. 16,1998, entitled "Testing And Burn-In Of IC Chips Using Radio Frequency Transmission," now U.S. Pat. No. 6,161,205.

USPTO Transaction History of related U.S. Appl. No. 09/437,718, filed Nov. 9, 1999, entitled "In-Sheet Teanseciever Testing," now U.S. Pat. No. 6,487,681.

USPTO Transaction History of related U.S. Appl. No. 09/675,452, filed Sep. 28, 2000, entitled "Testing and Burn-In of IC Chips Using Radio Frequency Transmission," now U.S. Pat. No. 6,357,025.

USPTO Transaction History of related U.S. Appl. No. 11/864,708, filed Sep. 28, 2007, entitled "Method and Apparatus for RFID Communication."

USPTO Transaction History of related U.S. Appl. No. 11/864,710, filed Sep. 28, 2007, entitled "Method and Apparatus for RFID Communication."

USPTO Transaction History of related U.S. Appl. No. 11/864,715, filed Sep. 28, 2007, entitled "Method and Apparatus for RFID Communication."

USPTO Transaction History of related U.S. Appl. No. 11/864,718, filed Sep. 28, 2007, entitled "Method and Apparatus for RFID Communication."

USPTO Transaction History of related U.S. Appl. No. 11/864,723, filed Sep. 28, 2007, entitled "Method and Apparatus for RFID Communication."

A Study on Accelerated Preconditioning Test, Yesbeng Sun et al., 1997 IEEE, pp. 98-101.

On Wafer Bum-In Strategies For MCM DIE.sup.1, Adit D. Singh, MCM '94 Proceedings, pp. 255-260.

Relative Effectiveness of Thermal Cycling Versus Burn-In: A Case Study, F. LoVasco & K. Lo, Electronic Components and Technology Conference,1992 Proceedings., 42.sup.nd, 7 pages.

A non-contacting probe for measurements on high frequency planar circuits, Osofsky et al., Microwave Symposium Digest, 1989, IEEE, pp. 823-825.

* cited by examiner

METHOD AND APPARATUS FOR COMMUNICATING WITH RFID DEVICES COUPLED TO A ROLL OF FLEXIBLE MATERIAL

Matter enclosed in heavy brackets [ ] appears in the original patent but forms no part of this reissue specification; matter printed in italics indicates the additions made by reissue.

*RELATED REISSUE APPLICATIONS*

*More than one reissue application has been filed for the reissue of U.S. Pat. No. 6,487,681. The reissue applications are the initial reissue application Ser. No. 10/997,556 filed Nov. 24, 2004, a continuation reissue application Ser. No. 11/864,708 filed Sep. 28, 2007, a continuation reissue application Ser. No. 11/864,710 filed Sep. 28, 2007, a continuation reissue application Ser. No. 11/864,715 filed Sep. 28, 2007, a continuation reissue application Ser. No. 11/864,718 filed Sep. 28, 2007, and a continuation reissue application Ser. No. 11/864,723 filed Sep. 28, 2007.*

CROSS REFERENCE TO RELATED APPLICATIONS

This application a continuation of application Ser. No. 08/306,906 filed Sep. 15, 1994, now U.S. Pat. No. 5,983,363, which is a continuation in part of and claims priority from U.S. patent application Ser. No. 07/979,607 filed Nov. 20, 1992, now U.S. Pat. No. 6,058,497.

FIELD OF THE INVENTION

This invention relates to transponder testing and to test systems, fixtures, and methods for testing transponders.

BACKGROUND OF THE INVENTION

As an introduction to the problems solved by the present invention, consider the conventional transponder used for radio frequency identification (RFID). Such a transponder includes a radio transceiver with a built-in antenna for receiving command message signals and for transmitting reply message signals. Inexpensive transponders find application in systems for tracking material, personnel, and animals, inventory management, baggage handling, and the mail to name a few major areas.

A transponder necessarily includes a transceiver. Such transponders may include an integrated circuit transceiver, a battery, and a printed circuit antenna hermetically encapsulated in a laminated package about 1 inch square and approximately as thick as a mailing label or tag. In such a laminated package, manufacturing acceptance tests on each unit become difficult and costly.

Conventional transponders are inexpensively manufactured in sheets having for example 250 integrated circuit transceivers spaced apart in a row and column array between polymer films. Prior to use, the transponders are separated from each other by shearing the sheet between adjacent rows and columns. Conventional testing methods and apparatus cannot be used until the transponders are separated from each other.

Conventional manufacturing acceptance tests for transponders are based in part on antenna performance tests that simulate the application in which the transponder will be used. These so called "far-field" tests require a large anechoic chamber and individual testing of a single transponder at a time. Such far-field testing adds significantly to the per unit cost of inexpensive transponders.

Without inexpensive transponder testing for manufacturing acceptance tests, incomplete testing may perpetrate unreliable tracking, inventory, and handling systems, increase the cost of maintaining such systems, and discourage further development and popular acceptance of transponder technology.

In view of the problems described above and related problems that consequently become apparent to those skilled in the applicable arts, the need remains in transponder testing for more accurate and less costly test systems, fixtures, and test methods.

SUMMARY OF THE INVENTION

Accordingly, a test system in one embodiment of the present invention includes a fixture, an interrogator, and a switch cooperating for testing a sheet containing a plurality of transceivers, each transceiver within a contour on the sheet. The fixture, in one embodiment, admits a sheet of transceivers and surrounds each transceiver at its contour so that each transceiver is respectively enclosed within an enclosure. Within each enclosure is an antenna for so called "near-field" communication. The interrogator determines a command signal and evaluates reply signals from each transceiver. The switch is coupled in series between each antenna and the interrogator for selecting an antenna for transmitting the command signal and for receiving the reply signal.

According to a first aspect of such an embodiment, the fixture isolates transceivers from each other so that multiple transceivers are tested simultaneously. By isolating each transceiver, interference from adjacent transceivers is minimized, transponder identity and location are not confused, and test transmissions are prevented from affecting external equipment including other test stations.

According to another aspect, testing is facilitated by isolating each transceiver at its contour.

According to another aspect, multiple transceivers are moved as a sheet and tested without further handling so that rapid testing is feasible and delays for physical alignment of the transceivers within the fixture is minimized.

According to another aspect, near-field testing is used to eliminate the need for large chambers.

According to another aspect of such a test system, the transfer function of the antenna and detector portion of a transceiver receiver is tested.

The present invention is practiced according to a method in one embodiment which includes the steps of providing an enclosure that admits a sheet of transceivers, each transceiver formed within a respective region of the sheet, closing the enclosure to form an RF seal about each respective region, and operating each transceiver for receiving and transmitting signals.

According to a first aspect of such a method, independent testing of individual transceivers is accomplished for in-sheet transceivers and multiple transceivers are tested simultaneously.

According to another aspect, far-field tests are used to confirm the test signal used in manufacturing tests.

A method, in an alternate embodiment, for testing battery-operated transceivers includes the step of transmitting a wake up signal to a transceiver. According to a first aspect of such a method, only transceivers under test are made operational so that battery power is conserved in other transceivers.

*In accordance with another embodiment, flexible radio frequency identification (RFID) devices are coupled to a roll of flexible material. Each RFID device coupled to the roll is advanced into a wireless communication region. An antenna in the region separately communicates with each of the RFID devices in a manner that isolates the communication from other RFID devices coupled to the roll outside the region.*

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

A person having ordinary skill in the art will recognize where portions of a diagram have been expanded to improve the clarity of the presentation.

In each functional block diagram, a broad arrow symbolically represents a group of signals that together signify a binary code. For example, a group of bus lines is represented by a broad arrow because a binary value conveyed by the bus is signified by the signals on the several bus lines taken together at an instant in time. A group of signals having no binary coded relationship is shown as a single line with an arrow. A single line between functional blocks represents one or more signals.

DETAILED DESCRIPTION OF THE INVENTION

Figure 1:
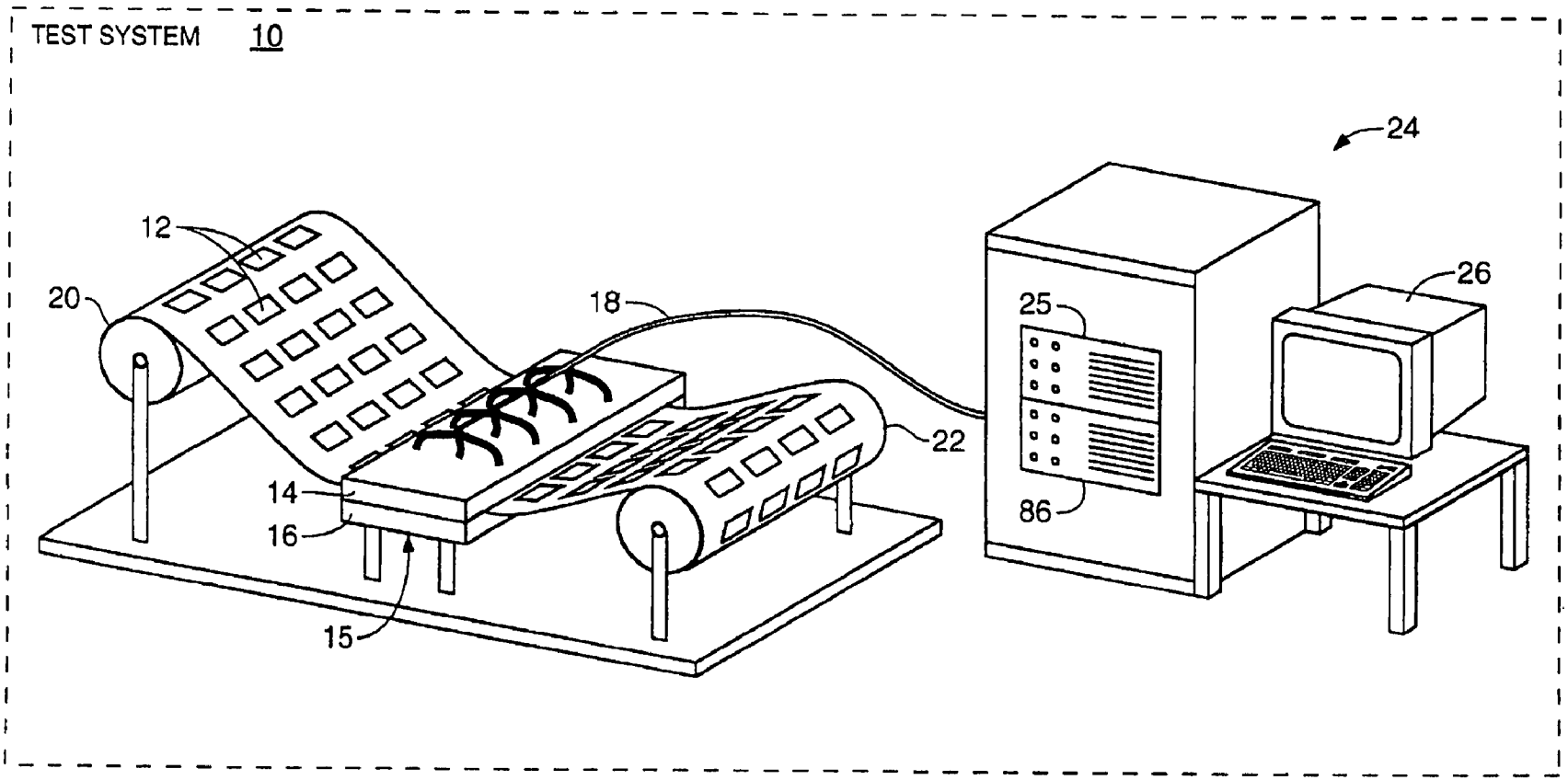
FIG. 1 is a plan view of a test system of the present invention.

FIG. 1 is a plan view of a test system of the present invention. Test system 10 provides manufacturing acceptance tests for an in-sheet transponder 12 provided on continuous roll 20 of laminated films. Transponders under test are located in fixture 15. Tested transponders are received on roll 22. Fixture 15 is connected by cable 18 to subsystem 24 so that signals generated by instrumentation in subsystem 24 are coupled to fixture 15 and so that signals received in fixture 15 are coupled to instruments in subsystem 24 for analysis. Subsystem 24 includes interrogator 25 and computer 86, cooperating for signal generation and analysis. Fixture 15 is characterized, according to a method of the present invention, using a correlation to far-field testing. Characterization of a system, fixture, or circuit conventionally includes making measurements of characteristic features of its structure and operation.

Transponders to be tested in an alternate embodiment are provided to fixture 15 in separated sheets, each sheet having an array of rows and columns of transponders. For example in one embodiment, about 250 transponders are manufactured in a sheet measuring about 18 inches by about 24 inches.

Test system 10 also includes materials handling equipment, not shown, for supplying sheets or rolls of transponders for testing, for aligning transponders within fixture 15, and for receiving tested transponders for further manufacturing steps. In one embodiment, individual tested transponders are separated (singulated) from the sheet in which testing occurred and are provided on an adhesive backing for distribution as tape-and-reel components or ready-to-use articles such as baggage tags, inventory labels, or badges, to name a few feasible applications.

Roll 20 includes a plurality of identical transponders, such as transponder 12. Transponder 12 is a radio frequency identification (RFID) device of the type described in U.S. patent application Ser. No. 07/990,918 by Snodgrass et al. filed Dec. 15, 1992, incorporated herein by reference. In one embodiment, transponder 12 is about 1 inch square, includes a lithium battery, an integrated circuit transceiver, and an antenna packaged using thin film and lamination techniques.

Figure 2:
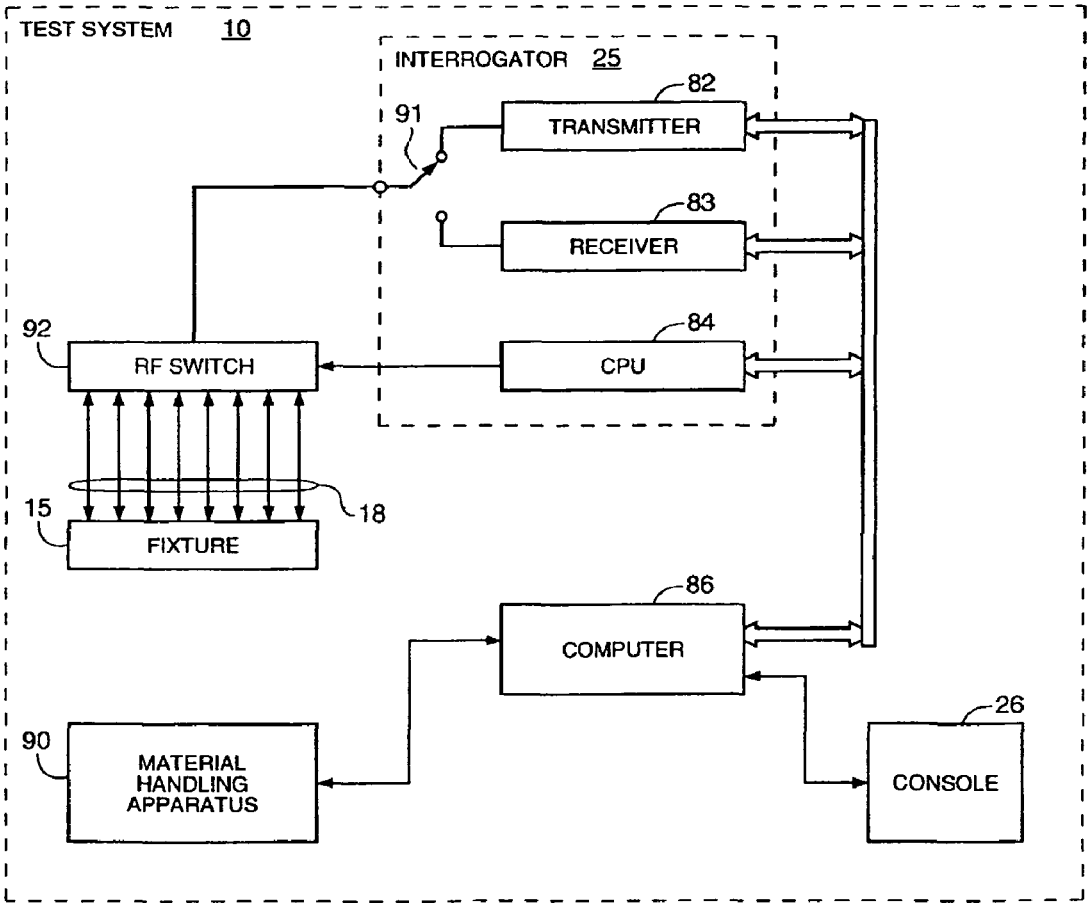
FIG. 2 is a functional block diagram of the test system of FIG. 1.

FIG. 2 is a functional block diagram of a test system of the present invention. Test system 10 includes six major functional elements: operator console 26, test system computer 86, interrogator 25, radio frequency (RF) switch 92, fixture 15, and material handling apparatus 90.

In operation, test system computer 86 directs material handling apparatus 90 to align a sheet of transponders (not shown) within fixture 15. Alignment assures that each transponder is isolated from other transponders in a manner to be discussed with reference to FIG. 4. In one embodiment, alignment includes automatic recognition by video camera of guide marks on the sheet and control of stepper motors according to software performed by computer 86 or in an alternate embodiment by a computer in material handling apparatus 90. One of ordinary skill will recognize that alignment includes the location of the fixture relative to the sheet so that the fixture, the sheet, or both can be repositioned to accomplish proper alignment.

When a sheet of transponders is aligned, computer 86 directs RF switch 92 for independently testing individual transponders. In a first embodiment, one transponder is tested at a time. In an alternate embodiment, multiple interrogators are coordinated to test multiple transponders simultaneously. Independent transponder operation during simultaneous testing of multiple transponders is accomplished in part by isolation provided by fixture 15.

During tests of each transponder, computer 86 directs interrogator 25, particularly interrogator central processing unit (CPU) 84, to generate and transmit via transmitter 82 command messages through switches 91 and 92, and to receive and interpret reply messages generated by that transponder that are conveyed through RF switch 92 and switch 91 to receiver 83. Interrogator 25 is of the type described in U.S. patent application Ser. No. 07/990,918 by Snodgrass et al. filed Dec. 15, 1992, incorporated herein by reference. Switch 91 and switch 92 are coax switches, common in the RF testing art. In alternate embodiments, switch 91 is eliminated and command and reply messages are separated by communication techniques known in the art, for example separation by time division or use of different frequency bands or different modulation techniques.

In one embodiment of the present invention, a test of the sensitivity of the receiver portion of the transceiver portion of a transponder under test includes transmitting from interrogator 25 a test signal, for example, a command message at a test power level. Transponders that fail to respond by transmitting a proper reply message fail the test at a first point. In another embodiment, the reply message includes a measurement of the signal strength seen by the receiver portion of the transponder under test. Transponders that report measurements of received signal strength that do not exceed an expected signal strength fail the test at a second point. By setting both test points as requirements, the population of tested transponders is of higher quality because marginal units are rejected. Therefore, the determination of the test power level and the expected signal strength are important to production and application economics.

Fixture 15 surrounds each transponder so that each transceiver's antenna is within one enclosure. In one embodiment, the enclosure surrounds an entire transponder and a small volume of ambient air so that the enclosure forms a cavity. In an alternate embodiment, only the transceiver's antenna is enclosed. In yet another alternate embodiment, the small volume is filled with potting material so that, for example, the cleanliness of the enclosure and the position of the antenna within the enclosure are maintained. In one embodiment, the potting material includes polyimide. In alternate embodiments, conventional potting materials and conventional materials used for films for encapsulating the transponder are used. The power level to be used for each so enclosure depends on the materials and dimensions of the enclosure and the transponder.

To determine the test power level appropriate for one of several enclosures formed by fixture 15, far-field test results are correlated to conventional characterization tests of the transponder, potting material (if any), and the enclosure. By repeating characterization tests in each enclosure, a so called cavity transfer function relating test power level to received signal strength is determined for each enclosure of fixture 15.

Figure 3:
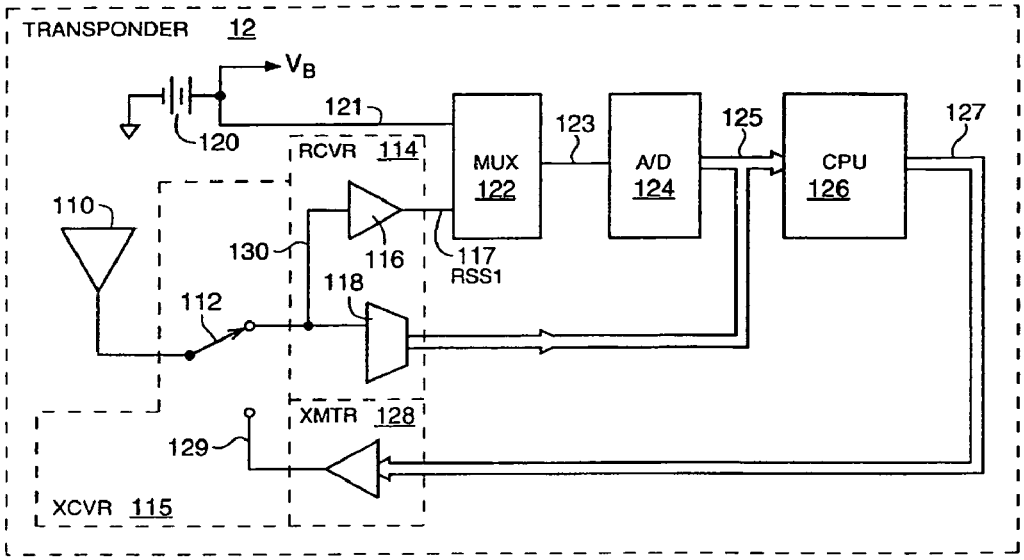
FIG. 3 is a functional block diagram of a transponder of the present invention to be tested in the test system of FIG. 1.

FIG. 3 is a functional block diagram of a transponder of the present invention to be tested in the test system of FIG. 1. Transponder 12 includes battery 120, antenna 110, transceiver 115, multiplexer 122, analog to digital (A/D) converter 124, and central processing unit (CPU) 126. Transceiver 115 includes transmit/receive switch 112, receiver 114, and transmitter 128. Transponder 12 operates from battery power provided by battery 120. All functional blocks are coupled to receive battery power signal VB.

In operation, CPU 126 directs multiplexer 122 to select one of several analog signals for conversion. For example, when a report of battery voltage is desired, line 121 is selected and coupled to A/D converter 124. In response to a signal on line 123, A/D converter 124 provides a digital signal on line 125 to CPU 126. CPU 126 then forms a message signal on line 127 and directs transmission by transmitter 128 through switch 112 and antenna 110.

Except for antenna 110 and battery 120, the circuitry of transponder 12 is conventionally formed as an integrated circuit, manufactured in large number on a wafer. In a preferred test method of the present invention, some manufacturing acceptance tests are conducted after fabrication of a wafer containing perhaps a thousand independent integrated circuits. For example, the conversion accuracy of A/D converter 124 varies from wafer to wafer depending on variations in the fabrication process. Prior to forming dice from the wafer, all or a representative sample of A/D converters, are tested by introducing stimulus signals and obtaining response signals via wafer probes, as is well known in the art. Test results are generalized to determine an A/D transfer function relating signals 123 and 125 for the A/D converters on a particular wafer.

Operation of transponder 12 includes at least two modes of operation. In a first mode, power is conserved by disabling most transponder circuits. When a wake up signal is received by antenna 110, coupled to receiver 114 through switch 112, detected and demodulated by receiver circuit 118, and interpreted by CPU 126 as a proper wake up signal, transponder 12 enters a second mode of operation. In the second mode, power is applied to substantially all transponder circuitry for normal operation. In a preferred embodiment, the test signal is both a wake up signal and a request for a report of received signal strength.

Receiver 114 includes detector 116 for detecting received signal strength. Antenna 110 is coupled through switch 112 to convey an RF signal on line 130 to detector 116. Detector 116 provides on line 117 to multiplexer 122 signal RSS1 proportional to received signal strength. When a report of received signal strength is desired, line 117 is selected and signal RSS1 is coupled to A/D converter 124. In response to a signal on line 123, A/D converter 124 provides a digital signal on line 125 to CPU 126. CPU 126 then forms a message signal on line 127 and directs transmission by transmitter 128 through switch 112 and antenna 110.

Figure 4:
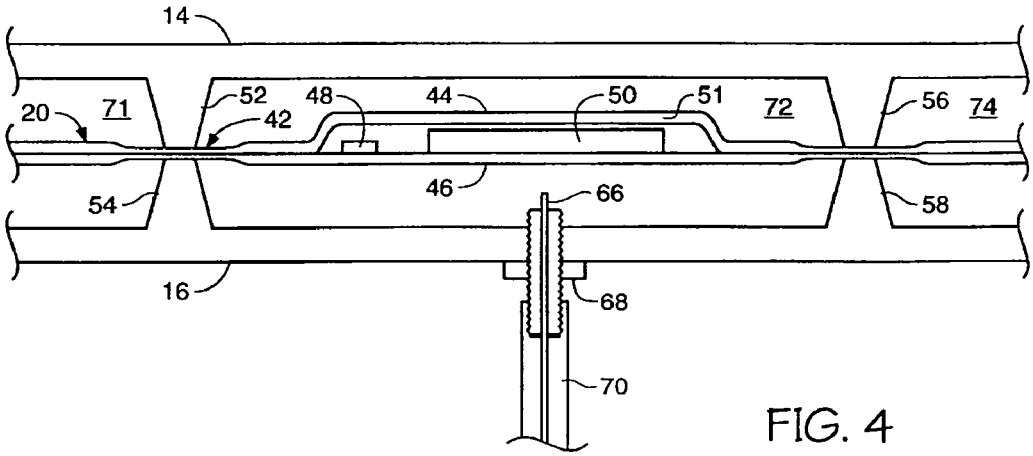
FIG. 4 is a cross sectional view of fixture 15.

FIG. 4 is a cross sectional view of fixture 15. Fixture 15 includes first section 14, second section 16, and an antenna in each enclosure (or cavity). For example, cavities 71, 72 and 74 are shown with antenna 66 in cavity 72. First section 14 includes a matrix of ridges, for example 52 and 56. Second section 16 includes a matching matrix of ridges, for example 54 and 58. Each pair of ridges for example 56 and 58 separates and defines adjacent cavities, for example cavities 72 and 74.

The upper surface of ridges 54 and 58 in second section 16 define a horizontal plane onto which a portion of roll 20 of laminated films is positioned. When that portion includes in-sheet transponders, material handling apparatus position the portion for in-sheet transponder testing. First section 14 and second section 16 are then pressed together against sheet 20 so that each transponder, for example transponder 51, is isolated from each other transponder in sheet 20. Ridges about each cavity form an RF seal.

The RF seal provides isolation. Isolation prevents RF energy radiated from antenna 66 in cavity 72 from interfering with tests conducted in adjacent cavity 74. The RF seal is not perfect and, therefore, isolation is not perfect, due to leakage for example between ridges 52 and 54 and between 56 and 58. Since leakage RF energy must pass through films 44 and 46, conventional shielding in the neighborhood of the contact between adjacent ridges is effective to further reduce leakage and thereby improve isolation. Such shielding includes placement of conductors and conductive materials within, between, and on the surfaces of films 44 and 46.

Isolation is operative to decouple an antenna in one enclosure from an antenna in an adjacent enclosure. From the point of view at antenna 66, when a signal originating in cavity 72 is stronger than a signal originating in cavity 74, for example, the signal sources and their respective antennas are considered decoupled from each other. Decoupling can also be accomplished by improving the gain of cavity 72, for example, by making its dimensions compatible with a wavelength of the signal originating in cavity 72.

In an alternate embodiment, first section 14 and second section 16 are fabricated as flat plates having no ridges 52, 54, 56, or 58. The distance between these plates is smaller than one wavelength of the signal originating in cavity 72 so that adjacent transponder antennas are effectively decoupled for purposes including manufacturing acceptance testing. In such an embodiment, first section 14 and second section 16 sandwich the sheet therebetween.

In a preferred embodiment, each transponder is formed within a square contour and each cavity has a matching square cross section so that transponders are isolated each one at its contour. In this sense, a contour extends through both films 44 and 46 to circumscribe one transponder. In a mathematical sense, a contour is defined on a surface. Since top film 44 has an upper surface, a first contour is defined on that top surface. Since bottom film 46 has a bottom surface, a second contour is defined on that bottom surface. The square cavity formed by ridges 54 and 58 in the second section is circumscribed by a third contour in the plane defined by the tops of the ridges on which the sheet is positioned. Thus, alignment includes positioning the sheet and the fixture so that the third contour formed on ridges 54 and 58 touches the sheet at the second contour on the bottom of film 46. When properly aligned, the first section, having a similar fourth contour on ridges 52 and 56, touches the first contour on the top of film 44. In a preferred embodiment, the first and second contours are directly opposed through the sheet. In alternate embodiments, ridges 52 and 54 touch film 44 along a sloped, concave, notched, or stepped surface for greater isolation. In such embodiments, important contours are not necessarily directly opposed.

Transponder 51 is identical to transponder 12 as previously described. Transponder 51 is of the type described as an enclosed transceiver in U.S. patent application Ser. No. 08/123,030, filed Sep. 14, 1993, incorporated herein by reference. The cross-sectional view of transponder 51 shows integrated circuit 48 and battery 50 between film 44 and film 46. Integrated circuit 48 includes the transceiver circuitry of transponder 51. Battery 50, in one embodiment, includes a metal surface coupled to operate as part of the antenna for the transceiver circuitry. Additional conductive traces on film 44 and film 46 cooperate for coupling battery power to integrated circuit 48 and for operation as part of the antenna for the transceiver. Films 44 and 46 are sealed to each other around a contour that encircles integrated circuit 48 and battery 50. In one embodiment, the seal is made by embossing so that the thickness of films 44 and 46 is reduced as shown at seal 42. After testing, transceiver 51 is separated from the sheet by cutting through films 44 and 46 at a point outside seal 42 so that transceiver 51 remains sealed after testing.

The central internal conductor of coax cable 70 is extended into cavity 72 for operation as a near-field antenna. Feed through fitting 68 holds coax cable 70 onto second section 16, shields the central conductor, and provides continuity of impedance from cable 70 up to antenna 66.

The amount of radiation coupled between antenna 66 and transponder 51 depends in part on several variables including the dimensions of cavity 72, the wavelengths of the radiated signals, potting or other materials (if any) within the enclosure, and the distance between antenna 66 and film 46. Although the location of transponder 51 is controlled by maintaining tension on sheet 20 as first section 14 is pressed against second section 16, these variables are expected to vary to some extent from cavity to cavity, from test to test, and over time with wear and handling of fixture 15 and operation and wear in materials handling apparatus used to position fixture 15, sheet 20, or both.

In a preferred embodiment, antenna 110 of transponder 12 is a square loop antenna for communication at about 2.45 gigahertz. The wavelength at that frequency is about 12.2 centimeters or about 4.82 inches. One of ordinary skill in the art will understand that cavity dimensions discussed above must lie outside the loop antenna. Conventional simulation may be used to arrive at sufficient or optimal dimensions of the cavity and sufficient or optimal dimensional characteristics of the antenna, including its placement and type (dipole, loop, stub, Marconi, etc).

According to a method of the present invention, the magnitude of signal 117 as shown in FIG. 3 is determined so that the effect of variation in the variables discussed above is removed from transponder test results and the pass rate for tested transponders is improved. Such a method begins with a first step of characterizing the encapsulated transponder with far-field tests. Before transponder 51 is tested in fixture 15, the digitization transfer function for analog to digital converter 124 shown in FIG. 3 is determined in a second step. As with the first step, in this second step 1, a desired level of accuracy for manufacturing acceptance tests is achieved using one of several approaches including design simulation, theoretical analysis, tests of a prototype, tests of representative samples, or tests of every transponder. In a preferred embodiment, sufficient accuracy is obtained for a manufacturing lot of transponders by conducting wafer probe tests for the second step.

In a third step, the cavity is characterized by design simulation, theoretical analysis, or conventional tests.

Fourth, a prototype or representative transponder 51 is placed in the cavity shown in FIG. 4 that was characterized in the third step. In a fifth step, a pass/fail test power level and the expected reported signal strength are determined by analysis of the results of tests made with the representative transponder, the characterization data, and the results of simulation and other techniques known in the art. Together the process of determining in this fifth step is defined as correlating far-field measurements with transceiver responses.

After test power level and response data are determined, manufacturing acceptance testing can proceed by replacing the representative transponder with an untested transponder 51. While in the cavity and isolated from other transponders, several tests are performed including a receiver sensitivity test.

A receiver sensitivity test of the present invention includes the following steps: radiating a test signal from antenna 66; converting analog signal RSS1 received by antenna 110 to a digital result on line 125; transmitting, by means of transmitter 128 and antenna 110, a message conveying the digital result; receiving the message via antenna 66; and making a pass/fail determination based on the response (if any) from the untested transponder. As one result, defects in antenna 110, switch 112, and receiver circuit 118 are made apparent.

The foregoing description discusses preferred embodiments of the present invention, which may be changed or modified without departing from the scope of the present invention.

For example, the orientation and shape of fixture 15 as two plates as shown in FIGS. 1 and 4 in alternate and equivalent embodiments are modified for cooperation with material handling apparatus, not shown. In one such modified orientation, the plane at which first section 14 and second section 16 meet is vertical rather than horizontal. In one such modified shape, the fixture has a spherical shape (rather than generally hexahedral), each contour surrounding a transponder is circular (rather than square), and each cavity is spherical (rather than generally hexahedral). In other embodiments, antenna 66 is located in various positions including, for example, in an opposite section of a cavity, within a ridge, in an adjoining cavity not completely isolated by ridges, or (for multiple antennas per cavity) at several of these locations.

Still further, those skilled in the art will understand that first section 14, second section 16, or both in alternate and equivalent embodiments are formed along an axis of turning to permit advancing a portion of sheet 20 as a portion of the fixture turns about its axis. In one embodiment, such movement moves and aligns sheet 20.

In a preferred embodiment, a microwave frequency band is used for transponder communication. The same band is used for transponder testing. In alternate embodiments that a person skilled in the art with knowledge of the teachings of the present invention would recognize as equivalents, another one or more frequency bands are utilized.

As still another example, the complexity of transponder 12 shown in FIG. 3 in alternate embodiments is simplified. Without departing from the scope of the present invention, for example, transmitter 128 is replaced with a transmitter responsive to an analog instead of a digital input, receiver circuit 118 is replaced with a circuit providing an analog rather than a digital output, analog to digital converter 124 is eliminated and CPU 126 is replaced with an analog rather than a digital circuit.

These and other changes and modifications known to those of ordinary skill are intended to be included within the scope of the present invention.

While for the sake of clarity and ease of description, several specific embodiments of the invention have been described; the scope of the invention is intended to be measured by the claims as set forth below. The description is not intended to be exhaustive or to limit the invention to the form disclosed. Other embodiments of the invention will be apparent in light of the disclosure to one of ordinary skill in the art to which the invention applies.

The words and phrases used in the claims are intended to be broadly construed. A "system" refers generally to electrical apparatus and includes but is not limited to rack and panel instrumentation, a packaged integrated circuit, an unpackaged integrated circuit, a combination of packaged or unpackaged integrated circuits or both, a microprocessor, a microcontroller, a memory, a register, a flip-flop, a charge-coupled device, combinations thereof, and equivalents.

A "signal" refers to mechanical and/or electromagnetic energy conveying information. When elements are coupled, a signal is conveyed in any manner feasible with regard to the nature of the coupling. For example, if several electrical conductors couple two elements, then the relevant signal comprises the energy on one, some, or all conductors at a given time or time period. When a physical property of a signal has a quantitative measure and the property is used by design to control or communicate information, then the signal is said to be characterized by having a "magnitude" or "value." The measure may be instantaneous or an average.

What is claimed is:

1. A method of testing the RF communication operation of an RF transponder, comprising the steps of:

providing a sheet characterized by first and second opposite faces and a thickness;

mounting on the sheet an RF transponder that includes a transponder RF antenna;

positioning a first RF shield so as to abut the first face of the sheet;

positioning a second RF shield so as to abut the second face of the sheet, the second RF shield being in the shape of a cup having a mouth abutting said second face, wherein the first and second RF shields are positioned so that the first and second RF shields together form a closed cavity which completely surrounds and encloses the transponder RF antenna except where the thickness of the sheet separates the first RF shield from the mouth of the second RF shield, wherein said thickness is sufficiently small so that the first and second RF shields prevent any RF signals within the cavity from radiating outside the cavity;

positioning a test fixture RF antenna within the cavity;

transmitting an RF signal from the test fixture antenna;

detecting a response by the transponder to the RF signal; and subsequently removing the transponder from proximity to the first and second shields and the test fixture RF antenna, so that no shielding obstructs the transponder RF antenna from sending and receiving RF radiation at any angle.

2. A method according to claim 1, wherein the cavity encloses the entire RF transponder.

3. A method according to claim 1, wherein the sheet has no shielding mounted thereon that obstructs RF radiation from the transponder RF antenna.

4. A method according to claim 1, wherein:

the first RF shield is in the shape of a cup having a mouth abutting the first face; and the step of positioning the second RF shield further comprises aligning the mouth of the second shield with the mouth of the first shield.

5. A method according to claim 1, wherein the step of positioning the test fixture RF antenna within the cavity comprises:

mounting the test fixture RF antenna to a surface of one of the two RF shields;

connecting an RF transmission line to the test fixture RF antenna; and passing the transmission line through an opening in said one RF shield to extend outside the cavity.

6. A method according to claim 1, further comprising the step of:

fabricating the sheet to include electrically conductive material adjacent the mouth of the second RF shield so as to improve RF shielding of the cavity.

7. A method according to claim 1, wherein the RF signal is transmitted at a predetermined wavelength, and wherein the RF shields are dimensioned to improve the gain of the cavity at that wavelength.

8. A method according to claim 1, wherein the RF signal is transmitted at a predetermined wavelength, and wherein the RF shields are dimensioned so that the cavity resonates at that wavelength.

9. A method of testing the RF communication operation of a plurality of RF transponders, comprising the steps of:

providing a sheet characterized by first and second opposite faces and a thickness;

mounting on the sheet a plurality of RF transponders, wherein each transponder includes a transponder RF antenna;

positioning a first test fixture section having a first RF shield so that the first RF shield abuts the first face of the sheet;

positioning a second test fixture section so as to abut the second face of the sheet, wherein:

the second test fixture section includes a plurality of RF shields, each RF shield in the second test fixture section is in the shape of a cup having a mouth abutting said second face of the sheet, the first and second test fixture sections so that each RF shield in the second test fixture section encircles a corresponding one of the transponder RF antennas so as to form, in combination with the first RF shield, a closed cavity that completely surrounds and encloses said corresponding transponder RF antenna except where the thickness of the sheet separates the first RF shield from the mouth of said RF shield in the second test fixture section, and said thickness is sufficiently small so that the first and second RF shields prevent any RF signals within the cavity from radiating outside the cavity;

positioning within each cavity a corresponding test fixture RF antenna;

transmitting an RF signal from each test fixture antenna;

detecting a response by [each] *at least one* transponder to the RF signal transmitted by its corresponding test fixture antenna; and subsequently removing each transponder from proximity to the first and second test fixture sections and the test fixture RF antennas, so that no shielding obstructs each transponder RF antenna from sending and receiving RF radiation at any angle.

10. A method according to claim 9, wherein the each cavity encloses the entire corresponding RF transponder.

11. A method according to claim 9, wherein:

the first RF shield is in the shape of a plurality of cups so that each cup has a mouth abutting the first face of the sheet; and the step of positioning the second RF shield further comprises aligning each mouth of the second shield with a corresponding mouth of the first shield.

12. A test fixture for testing the RF communication operation of an RF transponder which is mounted on a sheet which extends beyond the perimeter of the transponder, the RF transponder having an antenna for receiving RF signals, comprising:

first and second RF shields, the second RF shield being in the shape of a cup having a mouth;

an alignment mechanism for positioning the first and second RF shields to abut opposite sides of the sheet so that the mouth encircles the transponder antenna and so that the combination of the first and second RF shields forms a closed cavity completely surrounding and enclosing the transponder antenna except where the sheet separates the two RF shields, wherein the distance by which the sheet separates the two RF shields is small enough to prevent any RF signals within the cavity from radiating outside the cavity; and a test fixture RF antenna mounted within the cavity.

13. A test fixture according to claim 12, further comprising:

a test fixture RF transmitter having an output connected to the test fixture RF antenna so that the RF antenna radiates RF signals to the transponder RF antenna; and a test fixture RF receiver having an input connected to the test fixture RF antenna so that the RF receiver receives any responses transmitted by the RF transponder in response to said RF signals.

14. A test fixture according to claim 12, wherein the cavity encloses the entire transponder.

15. A test fixture according to claim 12, wherein:

the first RF shield is in the shape of a cup having a mouth abutting the first face; and the alignment mechanism aligns the mouth of the second shield with the mouth of the first shield.

16. A method according to claim 12, further comprising:

an RF transmission line connected to the test fixture RF antenna;

wherein the transmission line extends through an opening in one of the RF shields so as to extend outside the cavity.

17. A test fixture according to claim 12, further comprising a test fixture RF transmitter for providing to the transponder antenna RF test signals having a predetermined wavelength, wherein the first and second RF shields are dimensioned to improve the gain of the cavity at that wavelength.

18. A test fixture according to claim 12, further comprising a test fixture RF transmitter for providing to the transponder antenna RF test signals having a predetermined wavelength, wherein the first and second RF shields are dimensioned so that the cavity resonates at that wavelength.

19. A test fixture for testing the RF communication operation of a plurality of RF transponders mounted on a sheet, each RF transponder having an RF antenna, comprising:

a first test fixture section including a first RF shield;

a second test fixture section including a plurality of RF shields each of which is in the shape of a cup having a mouth;

an alignment mechanism for positioning the first and second test fixture sections to abut opposite sides of the sheet so that each RF shield in the second test fixture section encircles a corresponding one of the transponder antennas so as to form, in combination with the first RF shield, a closed cavity that completely surrounds and encloses said corresponding transponder RF antenna except where the sheet separates the first RF shield from the mouth of said RF shield in the second test fixture section, wherein the distance by which the sheet separates the first RF shield from each RF shield of the second test fixture section is small enough to prevent any RF signals within each cavity from radiating outside that cavity; and a test fixture RF antenna mounted within each cavity.

20. A test fixture according to claim 19, wherein:

the first RF shield is in the shape of a plurality of cups so that each cup has a mouth abutting the sheet; and the alignment mechanism aligns each mouth of the second shield with a corresponding mouth of the first shield.

*21. A method comprising the steps of:*

*providing, to a material handling apparatus, a plurality of flexible radio frequency identification (RFID) devices coupled to a continuous roll of flexible material;*

*advancing to a first region a first RFID device while coupled to the roll of flexible material, the first RFID device comprising a dipole antenna coupled to an integrated circuit;*

*transmitting a first wireless interrogation signal to the first RFID device within the first region; and*

*receiving a first wireless reply signal from the first RFID device within the first region, wherein RF energy associated with wireless communication with the first RFID device is sufficiently isolated to the first region to prevent communication interference with a separate RFID device coupled to the roll of flexible material.*

*22. The method of claim 21, further comprising the steps of:*

*advancing a second RFID device coupled to the roll of flexible material to a second region, wherein the second wireless interrogation signal is prevented from interfering with the first wireless interrogation signal; and*

*receiving a second wireless reply signal from the second RFID device within the second region, wherein RF energy associated with wireless communication with the second RFID device is sufficiently isolated to the second region to prevent communication interference with a separate RFID device coupled to the roll of flexible material, and wherein the second RFID device is in the second region while the first RFID device is simultaneously in the first region.*

*23. The method of claim 22, wherein the plurality of flexible RFID devices are coupled to the roll of flexible material in an array pattern comprising a plurality of rows and a plurality of columns.*

*24. The method of claim 21, further comprising the steps of:*

*separating the first RFID device from the roll of flexible material; and*

*adhering the first RFID device to an article for tracking.*

*25. The method of claim 24, wherein the step of attaching the first RFID device to an article comprises attaching the RFID device to baggage for use as a baggage tag in a baggage handling system.*

*26. The method of claim 24, wherein the step of attaching the first RFID device to an article comprises adhering the RFID device to the article for use as a tracking label.*

*27. The method of claim 21, wherein the first RFID device further comprises a flexible polymer substrate upon which the dipole antenna and the integrated circuit are disposed.*

*28. The method of claim 21, wherein the step of advancing the first RFID device comprises aligning the first RFID device to a first location using guide marks formed on the flexible material.*

*29. The method of claim 28, wherein using guide marks includes optically aligning the guide marks to the location.*

*30. The method of claim 21, wherein the first wireless reply signal includes an indication of signal strength of the first wireless interrogation signal as determined by the first RFID device.*

*31. The method of claim 21, wherein the antenna comprises a printed conductive material.*

*32. The method of claim 27, wherein the flexible material is a polymer film comprising the polymer substrate of the RFID device.*

*33. A system comprising:*

*a material handling apparatus:*

*a plurality of flexible RFID devices removably attached to a continuous roll of flexible material mounted on the material handling apparatus, each of the plurality of flexible RFID devices comprising a respective dipole antenna coupled to a respective integrated circuit and disposed on a respective flexible polymer substrate;*

*a first RFID device disposed in a first region, the first RFID device being removably attached to the continuous roll of flexible material, the first region configured to prevent a first adjacent RFID device of the plurality of flexible RFID devices from interfering with RF communication with the first RFID device in the first region; and*

*a first interrogation antenna disposed within the first region.*

*34. The system of claim 33, further comprising:*

*a second region having disposed therein the first adjacent RFID device, the second region configured to prevent a second adjacent RFID device of the plurality of flexible RFID devices from interfering with RF communication with the second RFID device in the second region; and*

*a second interrogation antenna disposed within the second region.*

*35. The system of claim 34, wherein the plurality of flexible RFID devices removably attached to the continuous roll of flexible material is configured in an array pattern comprising a plurality of rows and a plurality of columns.*

*36. The system of claim 33, wherein each of the plurality of flexible RFID devices further comprises a respective battery coupled to the respective integrated circuit.*

*37. The system of claim 33, wherein the material handling apparatus includes a motor to align the first RFID device within the first region.*

*38. The system of claim 37, wherein the continuous roll of flexible material includes guide marks for use in aligning the first RFID device.*

*39. The system of claim 33, wherein the flexible material is a polymer film and each respective flexible polymer substrate of the plurality of respective RFID devices comprises a respective portion of the flexible material.*

*40. A system comprising:*

*a material handling apparatus configured to receive a continuous roll of flexible material including a plurality of flexible RFID devices;*

*a motor to advance individual ones of the plurality of RFID devices separately into a first region; and*

*a first interrogation antenna disposed within the first region to communicate with the individual ones of the plurality of RFID devices while coupled to the roll, wherein RF signals are isolated to the first region to prevent confusion with other RFID devices coupled to the continuous roll.*

*41. The system of claim 40, further comprising a second interrogation antenna disposed within a second region, wherein RF signals are isolated to the second region to prevent confusion with other RFID devices coupled to the continuous roll.*

*42. The system of claim 41, wherein the motor and the material handling apparatus are configured to advance a first RFID device of the plurality of flexible RFID devices into the first region and to simultaneously advance a second RFID device of the plurality of flexible RFID devices into the second region.*

*43. The system of claim 42, wherein the plurality of flexible RFID devices is configured in an array pattern comprising a plurality of rows and a plurality of columns.*

*44. The system of claim 43, further comprising an array of enclosures, the array comprising a plurality of rows of enclosures and a plurality of columns of enclosures, each enclosure of the array having a respective antenna disposed therein and configured to isolate RF energy within each respective enclosure to prevent RF interference between enclosures.*

*45. The system of claim 40, further comprising an alignment mechanism to align the RFID devices within the first region.*

*46. The system of claim 45, wherein the alignment mechanism includes an optical receiver.*

*47. A method comprising:*

*providing a system containing a plurality of flexible radio frequency identification (RFID) labels coupled to a continuous sheet of flexible material, each of the plurality of flexible RFID labels comprising a respective antenna coupled to a respective integrated circuit disposed on a respective, flexible polymer film;*

*advancing a first RFID label of the plurality of RFID labels to a wireless communication region of the system;*

*transmitting a first wireless signal to the first RFID label while the first RFID label is in the wireless communication region of the system and is coupled to the sheet, the first wireless signal being effectively isolated to the wireless communication region of the system to prevent interference by a separate RFID label external to the wireless communication region and coupled to the continuous sheet; and*

*attaching the first RFID label to an article for tracking in accordance with an article tracking process.*

*48. The method of claim 47, wherein the continuous sheet of flexible material is in the form of a roll.*

*49. The method of claim 47, further comprising wirelessly testing the first RFID label while the first RFID label is in the wireless communication region of the system.*

*50. The method of claim 49, further comprising receiving a first wireless reply signal from the first RFID label and evaluating the first reply signal to determine that the first RFID label passes a test.*

*51. The method of claim 49, wherein testing comprises near-field testing.*

*52. The method of claim 49, further comprising wirelessly testing at least one other RFID label of the plurality of RFID labels while the first RFID label is being tested.*

*53. The method of claim 47, further comprising:*

*advancing the first RFID label out of the wireless communication region of the system while advancing a second RFID label of the plurality of RFID labels into the wireless communication region of the system; and*

*transmitting a second wireless signal to the second RFID label while the second RFID label is in the wireless communication region of the system.*

*54. The method of claim 53, wherein the continuous sheet of flexible material is in the form of a roll.*

*55. The method of claim 53, further comprising wirelessly testing a third RFID label of the plurality of RFID labels while the second RFID label is in the wireless communication region of the system.*

*56. The method of claim 47, wherein advancing the first RFID label comprises aligning the first RFID label to a first location using guide marks.*

*57. The method of claim 47, wherein the respective polymer film of each of the plurality of flexible RFID labels comprises a respective portion of the flexible material.*

*58. A method comprising:*

*providing an apparatus with a continuous sheet of flexible material including a plurality of flexible RFID devices;*

*advancing an RFID device of the plurality of RFID devices into a wireless communication region of the apparatus while the RFID device is coupled to the continuous sheet of flexible material;*

*wirelessly communicating, via an interrogation antenna, with the RFID device in the wireless communication region in a manner that prevents communication between the antenna and an adjacent RFID device external to the region and coupled to the continuous sheet of flexible material; and*

*attaching the RFID device to a respective article for tracking in accordance with an article tracking process.*

*59. The method of claim 58, wherein the continuous sheet of flexible material includes flexible RFID devices in an array pattern comprising a plurality of rows and a plurality of columns.*

*60. The method of claim 58, wherein the continuous sheet of flexible material is in the form of a roll.*

*61. The method of claim 58, wherein advancing the RFID device comprises aligning the RFID device to a first location using guide marks.*

*62. The method of claim 58, wherein communicating includes near-field communication.*

*63. The method of claim 58, wherein communicating includes near-field testing of the RFID device.*

*64. The method of claim 58, wherein the RFID device comprises a first flexible layer attached directly to a second flexible layer.*

*65. The method of claim 64, wherein the first flexible layer comprises a portion of the flexible material.*

*66. The method of claim 64, wherein the RFID device comprises a dipole antenna.*

*67. The method of claim 64, wherein a thickness along a contour of the RFID device is less than a thickness through an integrated circuit region of the RFID device.*

*68. The method of claim 58, wherein the RFID device includes a battery.*

*69. A system comprising:*

*a first reel;*

*a second reel;*

*an interrogator antenna configured to transmit RF signals having a wavelength;*

*two plates separated by a distance of less than the wavelength;*

*a roll of flexible material extending from the first reel, between the two plates, to the second reel, wherein the roll comprises a plurality of RFID devices; and*

*a motor to align a first RFID device of the plurality of RFID devices between the two plates, wherein the RF signals from the antenna are isolated from an adjacent RFID device of the plurality of RFID devices.*

*70. The system of claim 69, further comprising a computer and a first interrogator coupled to the antenna and configured to generate the RF signals and to analyze a reply signal from the first RFID device to determine if the first RFID device fails a test.*

*71. The system of claim 69, wherein the first RFID device comprises a dipole antenna.*

*72. The system of claim 71, wherein the roll comprises polymer film 86 which the dipole antenna is disposed.*

*73. The system of claim 69, wherein the first RFID device is attached directly to the adjacent RFID device.*

* * * * *

UNITED STATES PATENT AND TRADEMARK OFFICE

CERTIFICATE OF CORRECTION

PATENT NO. : RE42,872 E
APPLICATION NO. : 10/997556
DATED : October 25, 2011
INVENTOR(S) : Mark E. Tuttle et al.

It is certified that error appears in the above-identified patent and that said Letters Patent is hereby corrected as shown below:

Title Page, last line of ABSTRACT, "REID" should read --RFID--.
Column 16, line 42, delete "86" and insert the word --upon--.

Signed and Sealed this
Twenty-second Day of January, 2013

David J. Kappos

David J. Kappos
*Director of the United States Patent and Trademark Office*